(12) United States Patent
Chang et al.

(10) Patent No.: US 12,142,485 B2
(45) Date of Patent: *Nov. 12, 2024

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Hung-Pin Chang, New Taipei (TW); Tsang-Jiuh Wu, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/167,888

(22) Filed: Feb. 13, 2023

(65) Prior Publication Data

US 2023/0197464 A1 Jun. 22, 2023

Related U.S. Application Data

(63) Continuation of application No. 17/460,337, filed on Aug. 30, 2021, now Pat. No. 11,594,420.

(51) Int. Cl.
| | |
|---|---|
| *H01L 21/31* | (2006.01) |
| *H01L 21/027* | (2006.01) |
| *H01L 21/3065* | (2006.01) |
| *H01L 21/3105* | (2006.01) |
| *H01L 21/463* | (2006.01) |
| *H01L 21/02* | (2006.01) |

(52) U.S. Cl.
CPC .... *H01L 21/31055* (2013.01); *H01L 21/0273* (2013.01); *H01L 21/3065* (2013.01); *H01L 21/463* (2013.01); *H01L 21/02063* (2013.01)

(58) Field of Classification Search
CPC .......... H01L 21/31055; H01L 21/0273; H01L 21/3065; H01L 21/463; H01L 21/02063; H01L 21/3086; H01L 21/76898; H01L 21/31116
USPC ................................... 438/691–714
See application file for complete search history.

(56) References Cited

U.S. PATENT DOCUMENTS

| | | | |
|---|---|---|---|
| 6,706,587 B1 * | 3/2004 | Tsai | H01L 29/66181 |
| | | | 257/E21.396 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |

(Continued)

*Primary Examiner* — Duy Vu N Deo
(74) *Attorney, Agent, or Firm* — JCIPRNET

(57) ABSTRACT

A manufacturing method of a through substrate via includes at least the following steps. A protective liner is formed within an opening of a dielectric layer, where the opening exposes a portion of a semiconductor substrate underlying the dielectric layer. The portion of the semiconductor substrate is removed through the opening, where an overhang portion is formed at a top edge of the semiconductor substrate and masked by the protective liner after the removing. The overhang portion of the semiconductor substrate, the protective liner, and a portion of the dielectric layer adjoining the protective liner is removed to form a via hole. A conductive material is formed in the via hole.

20 Claims, 14 Drawing Sheets

(56) References Cited

U.S. PATENT DOCUMENTS

| | | |
|---|---|---|
| 9,443,783 B2 | 9/2016 | Lin et al. |
| 9,461,018 B1 | 10/2016 | Tsai et al. |
| 9,496,189 B2 | 11/2016 | Yu et al. |
| 9,543,148 B1 * | 1/2017 | Hudson ............. H01L 21/67069 |
| 9,666,502 B2 | 5/2017 | Chen et al. |
| 9,735,131 B2 | 8/2017 | Su et al. |
| 11,594,420 B1 * | 2/2023 | Chang ................. H01L 21/0273 |
| 2008/0050919 A1 * | 2/2008 | Van Aelst ........... B81C 1/00087 |
| | | 257/E21.252 |

* cited by examiner

SEMICONDUCTOR STRUCTURE AND MANUFACTURING METHOD THEREOF

CROSS-REFERENCE TO RELATED APPLICATION

This application is a continuation application of and claims the priority benefit of a prior application Ser. No. 17/460,337, filed on Aug. 30, 2021. The entirety of the above-mentioned patent application is hereby incorporated by reference herein and made a part of this specification.

BACKGROUND

In recent years, the semiconductor industry has experienced rapid growth due to continuous improvement in integration density of various electronic components. For the most part, this improvement in integration density has come from successive reductions in minimum feature size, which allows more components to be integrated into a given area. However, there are physical limitations to an achievable density in two-dimensional (2D) integrated circuits formation. As semiconductor technologies further advance, 3D integrated circuits (3DICs) have emerged as an effective alternative to further reduce the physical size of a die. One major challenge of 3D interconnects is the formation of through-substrate vias (TSVs) which penetrate through substrates and are used to electrically inter-couple features on opposite sides of the substrates. Accordingly, there is continuous effort in developing new mechanisms of forming semiconductor structures having improved electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
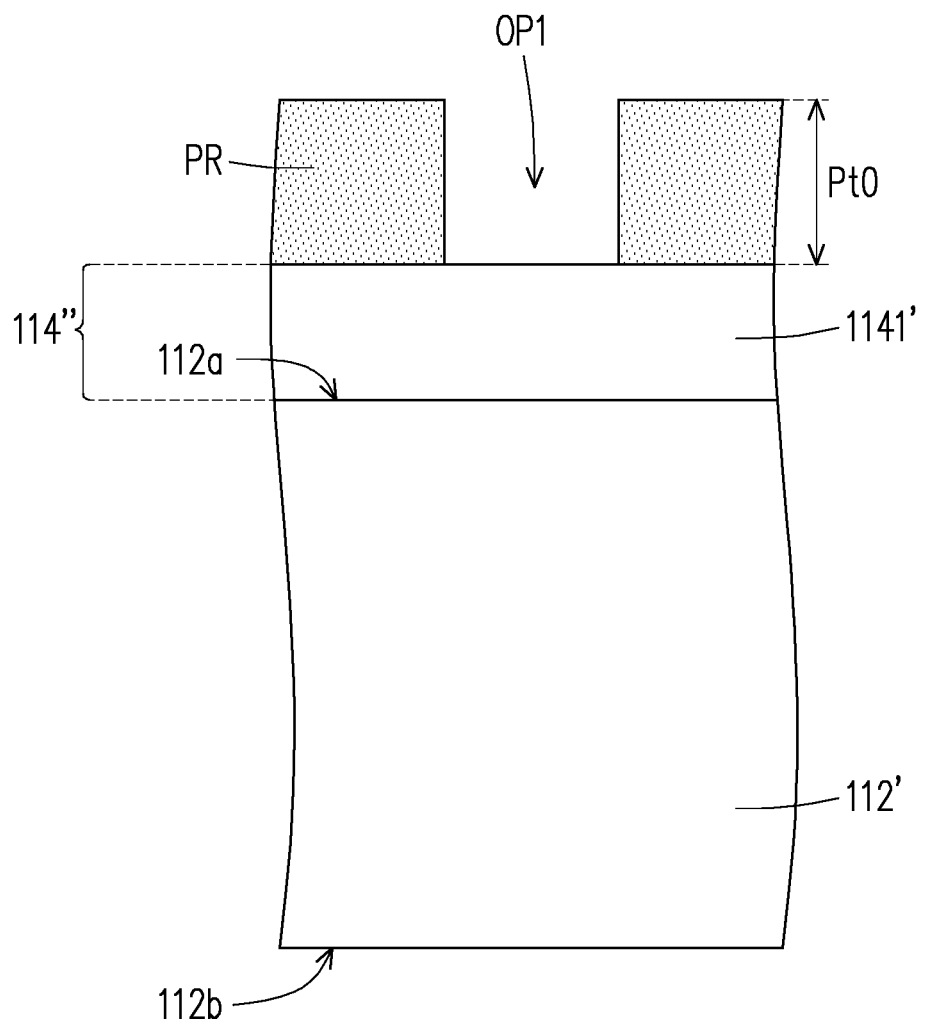
FIGS. 1A-1G are schematic and partial cross-sectional views showing various stages in a manufacturing method of a through substrate via according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A via structure and the method of forming the same, which may be applied to a through-substrate via process (e.g., through-silicon via or through-wafer via process) for forming a vertical interconnection on the stacked wafers/dies, are provided in accordance with some embodiments. The intermediate stages of manufacturing an embodiment are illustrated in FIGS. 1A-1G. In some embodiments, the via formation process is performed after the formation of the front-end-of-the line (FEOL) devices and before the formation of the interconnect structure. In some embodiments, the via formation process is performed after the formation of the FEOL devices and the interconnect structure. It is understood that specific embodiments are provided as examples to teach the broader inventive concept, and variations are fully intended to be included within the scope of the embodiments presented.

Referring to FIG. 1A, a portion of an interconnect structure 114' is formed over a semiconductor substrate 112', and a patterned mask layer PR is formed on the interconnect structure 114'. The semiconductor substrate 112' may include silicon or other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate 112' may include a silicon-on-insulator (SOI) substrate, a multi-layered substrate, a gradient substrate, and/or other suitable substrate. The semiconductor substrate 112' may have a front surface 112a (e.g., the surface facing upward in FIG. 1A), sometimes called an active side, and a rear surface 112b (e.g., the surface facing downwards in FIG. 1A), sometimes called a back side or an inactive side. In some embodiments, one or more FEOL features (not individually illustrated) may be formed on the front surface 112a of the semiconductor substrate 112' and electrically coupled to the interconnect structure 114'. The FEOL features may include gate structures, source/drain regions, other doped regions, isolation structures, contacts to one or more of the gate, source, or drain regions, memory elements (e.g. memory cells), and/or other features.

In some embodiments, the interconnect structure 114' is formed of alternating layers of dielectric (e.g., oxide, nitride, oxynitride, carbide, combinations thereof, and/or other suitable insulating material) and conductive material (e.g., copper, titanium, tungsten, aluminum, metal alloy, etc.) with vias interconnecting the layers of conductive material. The layers of conductive material may be formed through any suitable process (e.g., deposition, damascene, or the like). It should be noted that any number of layers of dielectric and conductive material are possible. The dielectric layer 1141' of the interconnect structure 114' may be a single layer or include multiple stacked layers. For example, the dielectric layer 1141' is an inter-layer dielectric (ILD) or may further include inter-metal dielectric (IMD). In some embodiments, the dielectric layer 1141 includes at least one low-k dielectric material such as a porous dielectric material that is referred to as an extremely low-k (ELK) dielectric material. For example, the low-k dielectric material has a dielectric constant less than about 3.0, such as in a range from about 2.5 to about 3.0. The interconnect structure 114' may be referred to as a back-end of the line (BEOL) feature that interconnects the FEOL features to form an integrated circuit. The details of the interconnect structure will be discussed later in accompanying with FIG. 3A.

In some embodiments, the patterned mask layer PR having at least one opening OP1 is formed on the outward facing surface of the interconnect structure 114' to serve as an etch mask for patterning the underlying structures. The patterned mask layer PR has an initial thickness Pt0 at this stage, where the initial thickness Pt0 may vary depending on process requirements and construes no limitation in the disclosure. In some embodiments, the patterned mask layer PR is a resist (e.g., photoresist). For example, the mask material is deposited on the interconnect structure 114', and then the mask material is patterned by exposure, baking, developing, and/or other lithographic processes to provide the opening OP1 in the patterned mask layer PR accessibly exposing at least a portion of the top surface of the dielectric layer 1141'. Alternatively, the patterned mask layer PR is a hard mask (e.g., a nitride or the like) that is deposited and etched to form the opening(s). Other suitable mask material may be employed.

Figure 1B:
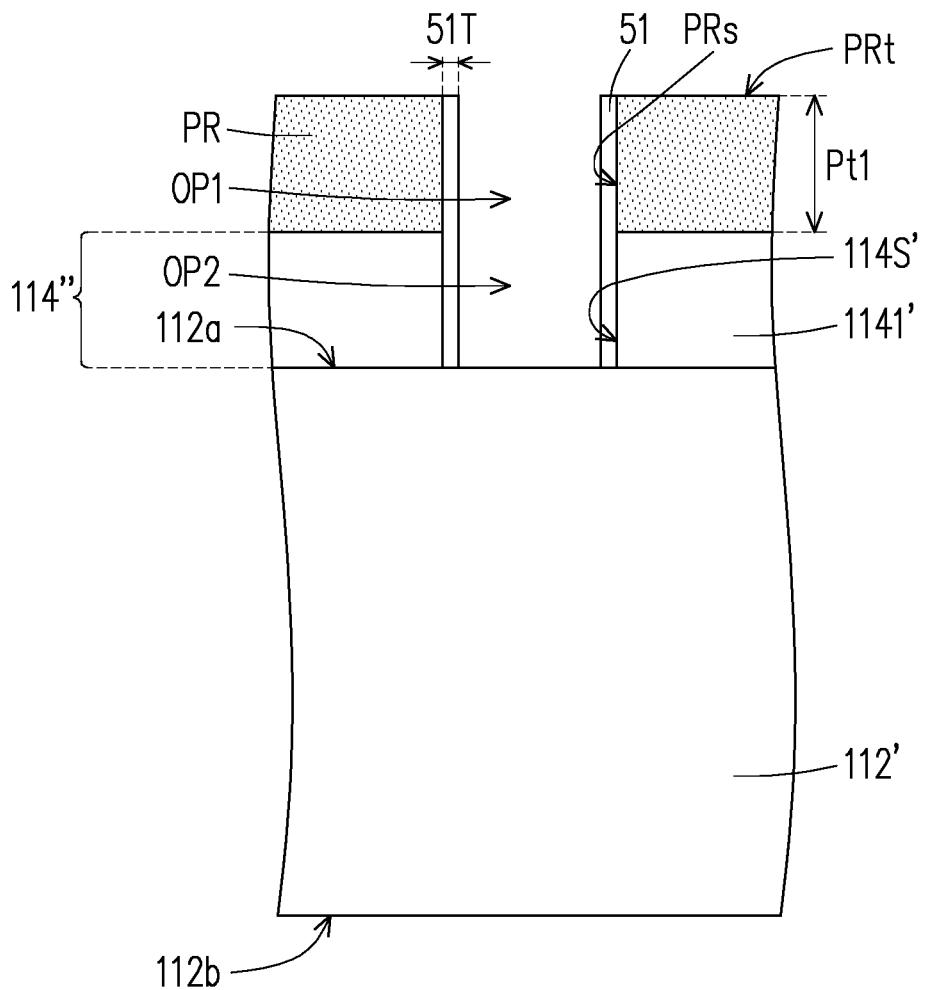

Referring to FIG. 1B and with reference to FIG. 1A, the portion of the dielectric layer 1141' underlying the opening OP1 is then removed to form an opening OP2 of the interconnect structure 114", using the patterned mask layer PR as a mask element. The opening OP2 is in communication with the opening OP1 and extends through the dielectric layer 1141' to accessibly expose at least a portion of the front surface 112a of the semiconductor substrate 112'. In some embodiments, the portion of the dielectric layer 1141' is removed using a wet etch process or a dry etch process, e.g., employing chemical etch, a plasma, ion bombardment, reactive ion etching, and/or the like. The reactants used to etch the dielectric layer 1141' may depend on the composition of the dielectric layer 1141'. The etching selectivity to the dielectric layer 1141' may be higher than the selectivity to patterned mask layer PR, thereby forming the opening OP2 into the dielectric layer 1141'. The etching creates the opening OP2 with relatively vertical profiles that stop at the front surface 112a of the semiconductor substrate 112'.

In some embodiments, a plasma etching process is performed. For example, a process gas is flowed through a process chamber and energy is applied to the electrodes at a sufficiently high potential to create a gaseous discharge that ionizes the process gas and generates plasma. The reactive species within the plasma may cause etching of the unmasked portion of the dielectric layer 1141' to form the opening OP2. The plasma may be produced in-situ in the process chamber or remotely and flowed to the process chamber. Various applicable methods (such as capacitively coupled plasma (CCP), inductively coupled plasma (ICP), magnetron plasma, electron cyclotron resonance (ECR), etc.) may be used to produce the plasma. It is appreciated that the process gas may be varied to produce a selective etch. For example, the process gas may be or may include a fluorine containing gas (such as CF based gases), an inert gas (such as Ar, He), a nitrogen source (such as $N_2$, $NH_3$), a weak oxidant (such as $O_2$), a gaseous mixture thereof, or the like.

In some embodiments, the plasma used to etch the dielectric layer 1141' is also used to passivate the exposed sidewalls of the dielectric layer 1141' and/or the patterned mask layer PR. The etching of the dielectric layer 1141' and the passivation of the exposed sidewalls to form a first protective film 51 may be performed sequentially in the same process chamber and/or at the same time. For example, the plasma may react with react-able materials (e.g., the dielectric layer 1141' and/or the patterned mask layer PR), and byproduct may thus be formed during the etching process. In some embodiments, the etching process leaves the etching byproduct on the exposed inner sidewalls that define the openings OP1 and OP2. In some embodiments, the process parameters are adjusted at the end of the etching operation to create the first protective film 51, e.g., by changing the gas source, changing gas flows, plasma charge characteristics, and/or the like. For example, the etching process may result in CF-based byproduct.

In some embodiments, leaving the etching byproduct in the openings OP1 and OP2 may protect the exposed inner sidewalls during subsequent processing steps. For example, the etching byproduct acting as the first protective film 51 may physically cover the inner sidewall PRs of the patterned mask layer PR and the inner sidewall 114S' of the interconnect structure 114". The first protective film 51 may have a thickness 51T ranging from about 500 nm to about 5000 nm. In certain embodiments, the thickness 51T of the first protective film 51 is about 3000 nm. The predetermined thickness 51T of the first protective film 51 may be achieved by adjusting the etching recipe (e.g., the reaction time, the flow rate of process gas, and/or the like) of the plasma etching treatment. For example, the reaction time is in the range between about 10% and 50% of dielectric opening time. In some embodiments, the top surface PRt of the patterned mask layer PR is substantially free of the first protective film 51 as a result of the ion bombardment. For example, ions generated from the process gas may bombard the dielectric materials during the etching process. The ion bombardment may be vertical, and the top surface PRt of the patterned mask layer PR is bombarded so that no film will be formed thereon. In addition, the patterned mask layer PR may be slightly thinned from the initial thickness Pt0 to the first thinned thickness Pt1. The reduced thickness may vary depending on the etching recipe and construes no limitation in the disclosure.

Figure 1C:
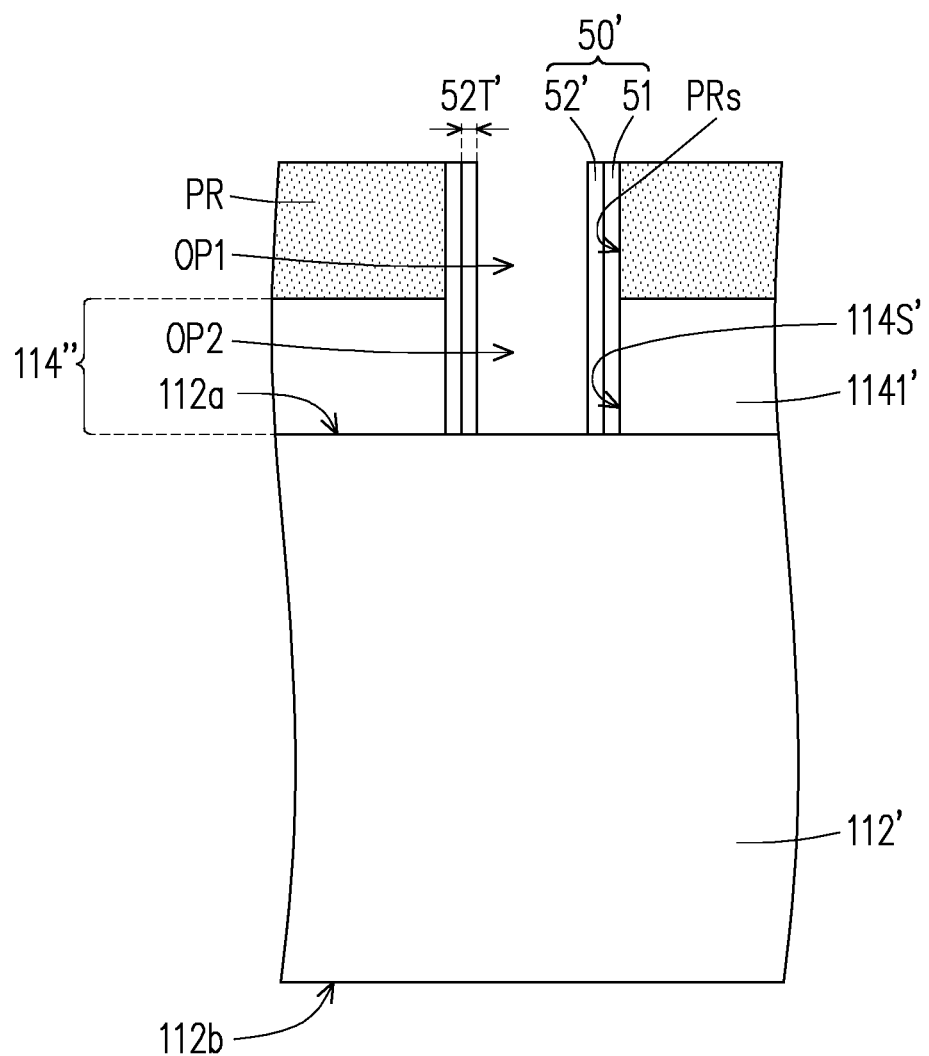

Referring to FIG. 1C and with reference to FIG. 1B, a second protective film 52' is formed on the first protective film 51. The second protective film 52' having directionality of film properties may be a single film or may include multiple sublayers and may be made of different material(s) than the first protective film 51. In some embodiments, the second protective film 52' is pre-coated in the same process chamber in which the etching is performed (such as the previous etching step and the subsequent etching steps in FIGS. 1B and 1D), by feeding the process chamber with a gaseous medium for plasma. For example, a plasma gas includes fluorocarbon gases such as $CF_4$/$CHF_3$ chemistry. Other gases such as $N_2$, $O_2$ and Ar may be used. In such embodiments, the second protective film 52' may be or may include a carbon-based material, a fluorine-based material, a combination thereof, or the like. Depending on gas chemistry used in the plasma process, the second protective film 52' may include a silicon-based material, in accordance with some embodiments.

In some embodiments, the second protective film 52' is made of a polymer that is sulfur-free, which assists in preventing undesired diffusion of sulfur or poly-sulfides during processing. For example, the chemistries may be adjusted, and sulfur-free gas chemistry is utilized in the process chamber during the pre-coating process. After the pre-coating, the second protective film 52' may physically cover the major surface (or vertical surface) of the first protective film 51 in a longitudinal direction. The exposed portion of the semiconductor substrate 112' and the top surface of the patterned mask layer PR may be free of the second protective film 52', since during the plasma process, ions bombard a film on the top surfaces of the patterned mask layer PR and the first protective film 51 while being pre-coated. The first protective film 51 may be physically interposed between the second protective film 52' and the interconnect structure 114", and also interposed between the second protective film 52' and patterned mask layer PR, in a lateral direction.

The second protective film 52' may have a first thickness 52T' ranging from about 500 nm to about 5000 nm. For example, the second protective film 52' is about 3000 nm in thickness. In some embodiments, the second protective film 52' is thicker than the first protective film 51 at this stage. Alternatively, the first thickness 52T' of the second protective film 52' may be substantially equal to (or less than) the thickness 51T of the first protective film 51. The first protective film 51 and the second protective film 52' may be collectively viewed as a protective structure 50' that may protect the dielectric layer 1141' from lateral etching in subsequent process. Since the first protective film 51 and the second protective film 52' may be removed in the subsequent process, the first protective film 51 and the second protective film 52' may also be viewed as a sacrificial structure.

Figure 1D:
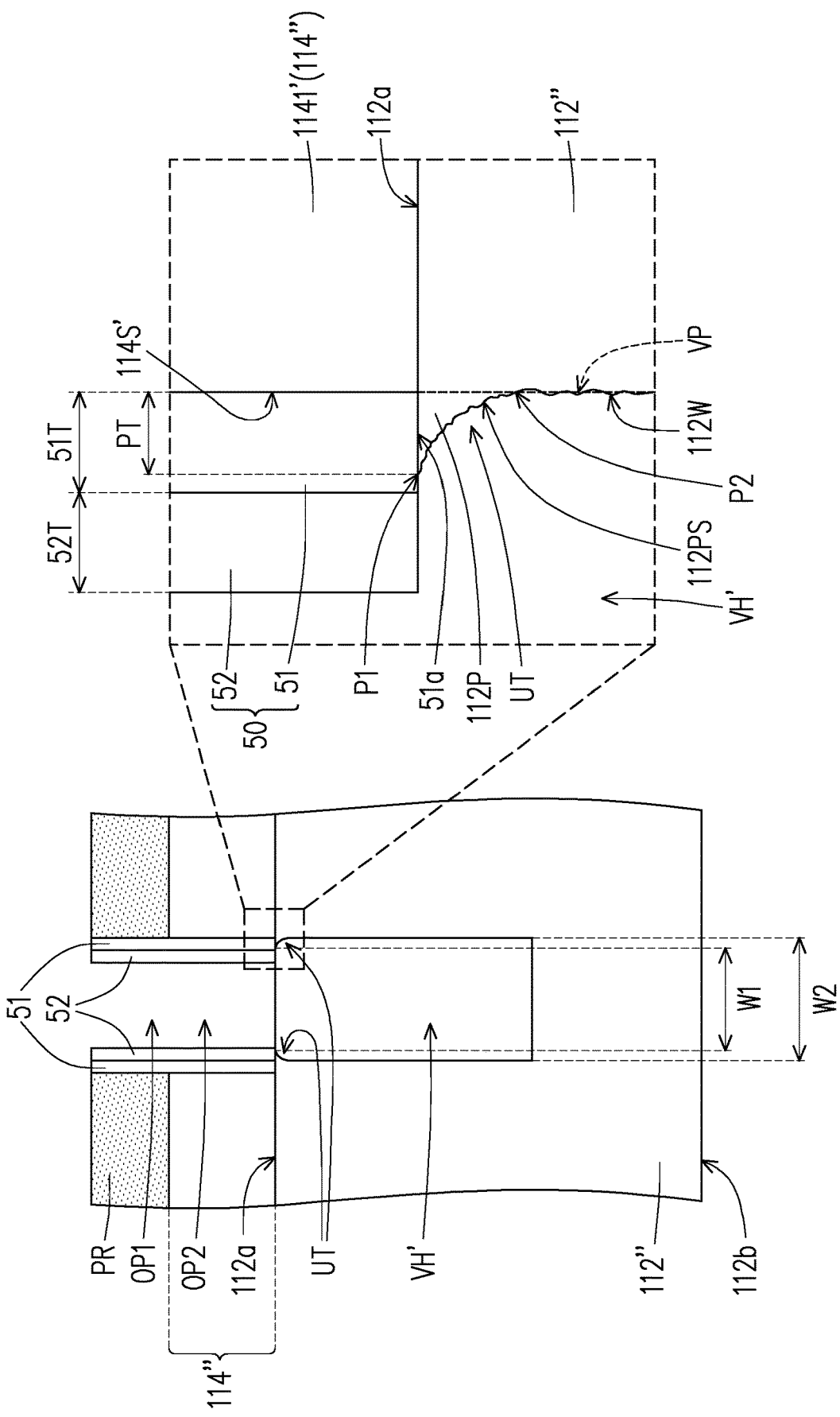

Referring to FIG. 1D and with reference to FIG. 1C, the semiconductor substrate 112" having a via hole VH' is formed. For example, the interconnect structure 114" and the overlying patterned mask layer PR serve as mask elements to form the via hole VH', where the via hole VH' may extend from the front surface 112a toward the rear surface 112b and pass through at least a portion of the semiconductor substrate 112'. In some embodiments, the via hole VH' does not penetrate through the semiconductor substrate 112" at this stage. The via hole VH' may be formed using any suitable etching method including a plasma etching process, a deep reactive ion etching process, a wet etching process, a laser drilling process, a combination thereof, and/or other processes. In some embodiments, at the via-hole etching step, the protective structure 50' protects the dielectric materials from lateral etching and may be thinned in the lateral direction to render the protective structure 50 having the second protective film 52 with a second thickness 52T. In some embodiments, the second thickness 52T is thinner than the thickness 51T of the first protective film 51. Alternatively, the second protective film is removed during the via-hole etching.

The etching process may create the roughed sidewall of the via hole VH' and may have a substantially vertical bottom sidewall profile and/or a tapered bottom sidewall profile. In some embodiments, an undercut portion UT is formed at the top corner of the via hole VH' during the via-hole etching process. For example, the undercut portion UT is at the interface between the semiconductor substrate 112" and the overlying first protective film 51 to create a neck region at the top portion of the via hole VH'. The undercut portion UT may refer to a recess in which the substrate material is removed to leave a portion of the semiconductor substrate overhanging the recess. In some embodiments, the via hole VH' formed in the semiconductor substrate 112" has a top opening width W1 and a bottom opening width W2 (as measured parallel to the front surface 112a of the semiconductor substrate 112"), where the top opening width W1 is substantially less than the bottom opening width W2.

With continued reference to FIG. 1D, the semiconductor substrate 112" may have an overhang portion 112P corresponding to the undercut portion UT. In some embodiments in which the via hole VH' is of a circular top-view shape, the semiconductor substrate 112" may have an annular overhang at the top edge. Other shapes of the overhang portion and the via hole may be possible. In some embodiments, the overhang portion 112P may have a bird's beak cross-sectional profile (or a tapering arc-shaped profile). In some embodiments, the overhang portion 112P has a substantially symmetrical curvilinear surface connected to the inner bottom sidewall 112W and the front surface 112a. The overhang portion 112P may be physically in contact with the protective structure 50 and extend at least from the interface of the dielectric layer 1141' and the first protective film 51 toward the second protective film 52. In some embodiments, the maximum width PT of the overhang portion 112P is less than the overall width of the protective structure 50. For example, the maximum width PT is substantially less than the thickness 51T of the first protective film 51.

In some embodiments, the width of the overhang portion 112P gradually decreases from a starting point P1 to an endpoint P2. The overhang portion 112P may have a cross section with substantially concave-down surface. For example, in the cross-sectional view, the starting point P1 of the curved surface 112PS of the overhang portion 112P is on the bottom surface 51a of the first protective film 51 of the protective structure 50. In some embodiments, the endpoint P2 of the curved surface 112PS of the overhang portion 112P is on a virtual plane VP where the inner sidewall 114S' of the interconnect structure 114" is located on. The interface of the interconnect structure 114" and the first protective film 51 is on the virtual plane VP. For example, the inner sidewall 114S' of the interconnect structure 114" is substantially leveled with the inner bottom sidewall 112W of the semiconductor substrate 112". In some other embodiments, the endpoint P2 of the curved surface 112PS of the overhang portion 112P is below the protective structure 50. The inner bottom sidewall 112W connected to the curved surface 112PS of the overhang portion 112P may be below the protective structure 50 or below the dielectric layer 1141' within process variations. The protective structure 50 may be thick enough so that the overhang portion 112P is formed below the protective structure 50 instead of below the interconnect structure 114". It is noted that the cross-sectional shape of the overhang 112P may vary by tuning the etching parameters (such as gas composition, the reaction time, etc.) and the thickness of the protective structure 50.

Figure 2A:
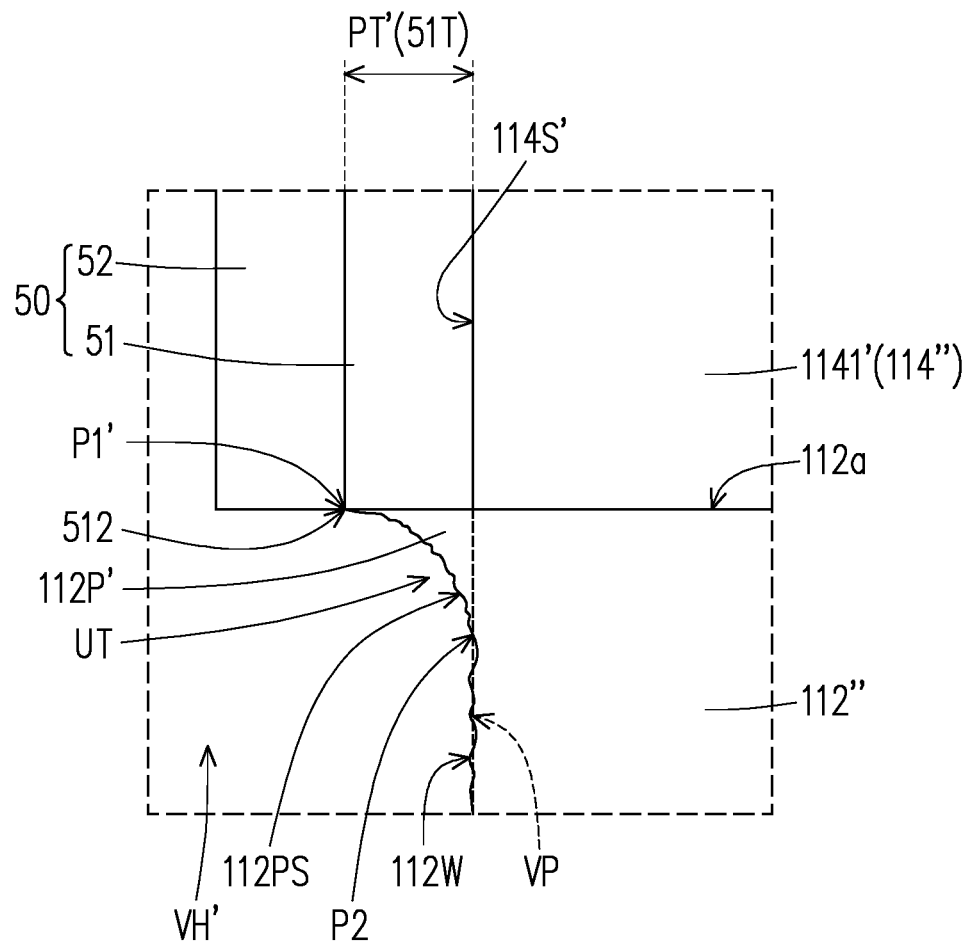
FIGS. 2A-2C are schematic and enlarged cross-sectional views showing variations of the structure in the dashed area outlined in FIG. 1D according to some embodiments.
Figure 2B:
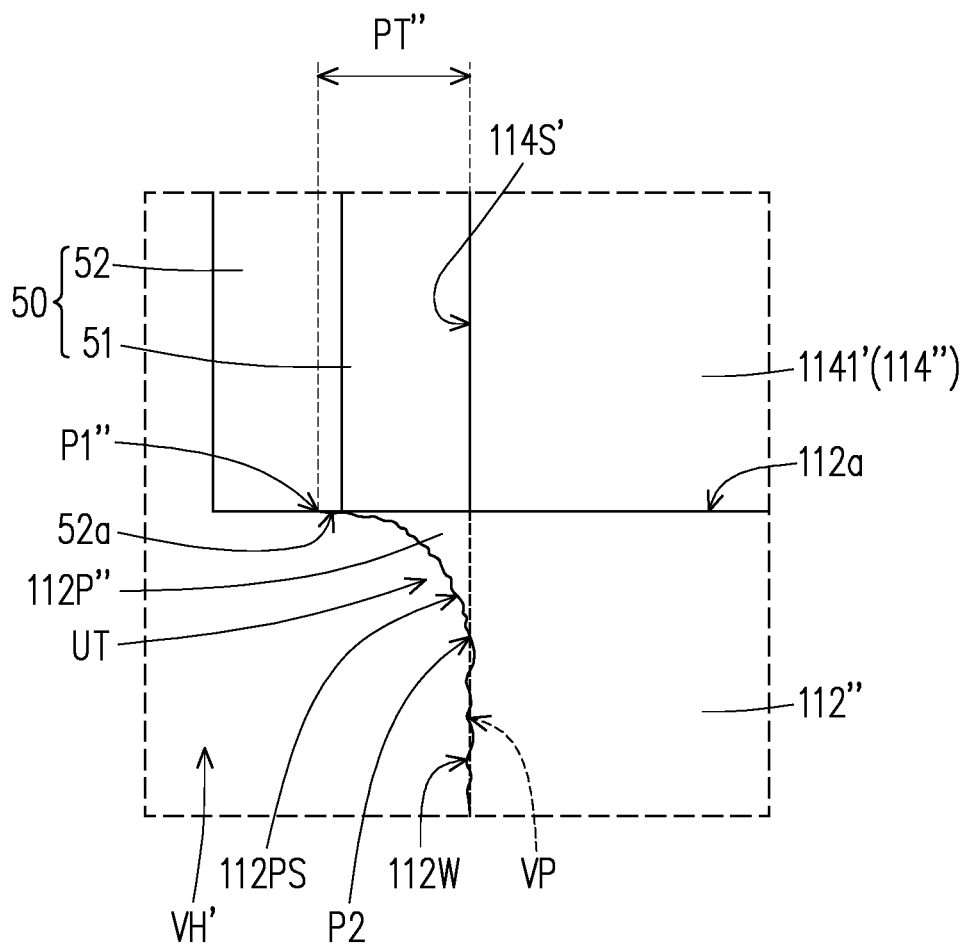
Figure 2C:
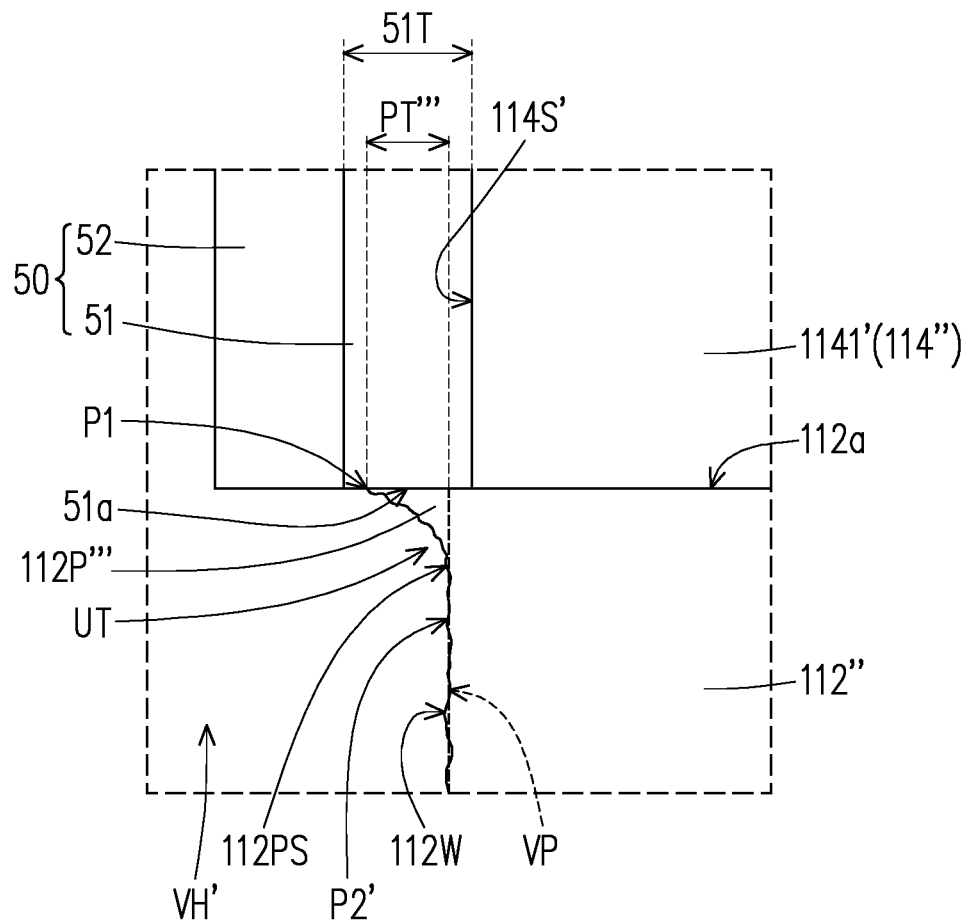

The variations of the overhang portion 112P are discussed in accompanying with FIGS. 2A-2C that shows the structure in the dashed area outlined in FIG. 1D. Referring to FIG. 2A, the starting point P1' of the curved surface 112PS of the overhang portion 112P' is at the interface 512 of the first protective film 51 and the second protective film 52. In some embodiments where the endpoint P2 is on the virtual plane VP, the maximum width PT' of the overhang portion 112P' is substantially equal to the thickness 51T of the first protective film 51. In some other embodiments, the endpoint of the curved surface of the overhang portion is below the bottom surface of the first protective film, and the maximum width of the overhang portion is less than the thickness of the first protective film.

Referring to FIG. 2B, the starting point P1" of the curved surface 112PS of the overhang portion 112P" is on the bottom surface 52a of the second protective film 52. In some embodiments where the endpoint P2 is on the virtual plane VP, the maximum width PT" of the overhang portion 112P" is greater than the thickness 51T of the first protective film 51 and may be substantially less than the overall thickness of the protective structure 50. In some other embodiments, the endpoint of the curved surface of the overhang portion is below the bottom surface of the first protective film, and the maximum width of the overhang portion may be less than or substantially equal to the thickness of the first protective film.

Referring to FIG. 2C, the endpoint P2' of the curved surface 112PS of the overhang portion 112P''' is below the bottom surface 51a of the first protective film 51, and the inner bottom sidewall 112W connected to the curved surface 112PS of the overhang portion 112P''' is also below the bottom surface 51a of the first protective film 51. In some embodiments where the starting point P1 of the curved surface 112PS of the overhang portion 112P is on the bottom surface 51a of the first protective film 51, the maximum width PT''' of the overhang portion 112P''' is substantially less than the thickness 51T of the first protective film 51.

Referring back to FIG. 1E and with reference to FIG. 1D, the semiconductor substrate 112 having the via hole VH and the interconnect structure 114 having the opening OP2 are formed by a trimming process. It is understood that the undercut between the dielectric layers and the semiconductor substrate may cause poor sidewall coverage, improper deposition of via materials, and the undercut may become an obstacle to accelerating the via filling process. The trimming process may be performed to remove the overhang portion of the semiconductor substrate, smooth the sidewall roughness of the via hole, and improve the via sidewall coverage for subsequent deposition processes. The trimming process may use any suitable method including a plasma dry etching process, a chemical wet etching process, and/or other processes. For example, the overhang portion 112P is entirely removed during the trimming. In some embodiments, after the trimming process, the via hole VH may have a top opening width W3 substantially greater than (or equal to) the bottom opening width W3. In some embodiments, the semiconductor substrate 112 may have an inclined inner sidewall 112S connected to the front surface 112a and the inner bottom sidewall 112W. For example, the inclined inner sidewall 112S is tilted outward from the via hole VH.

In some embodiments, the protective structure 50 and a portion of the interconnect structure 114" connected thereto are removed during the trimming. For example, the opening OP2' of the interconnect structure 114 has a top opening width greater than a bottom opening width. In some embodiments, the inner sidewall 114S of the interconnect structure 114 may be coterminous with the inclined inner sidewall 112S of the underlying semiconductor substrate 112, and the inner sidewall 114S of the interconnect structure 114 and the inclined inner sidewall 112S of the semiconductor substrate 112 may have substantially a same slope. Although the slopes of the inner sidewall 114S and the inclined inner sidewall 112S may be different due to the process variations and may vary depending on the process and product requirements. In some embodiments, the patterned mask layer PR is further thinned to a second thickness Pt2 during the trimming process.

Figure 1E:
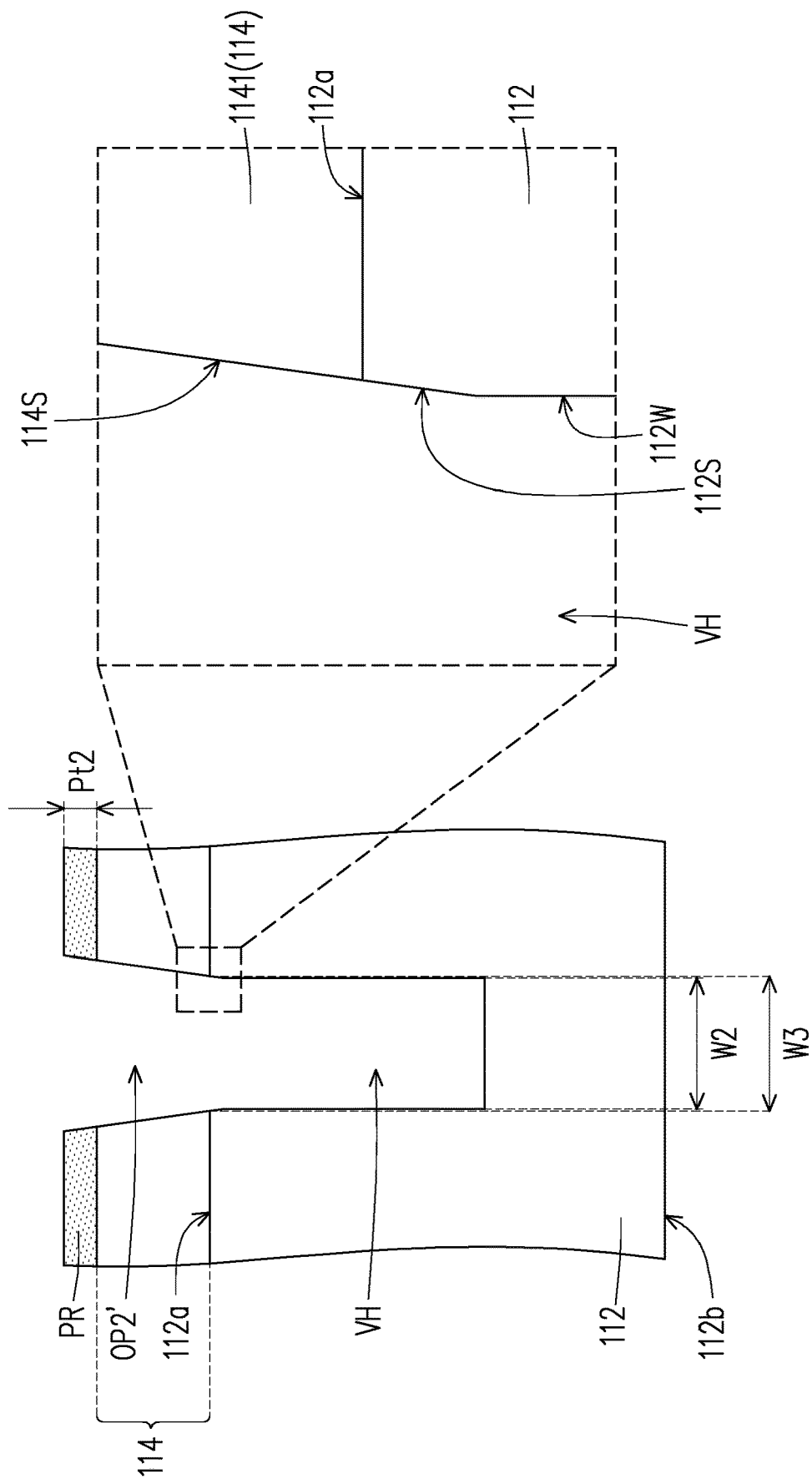
Figure 1F:
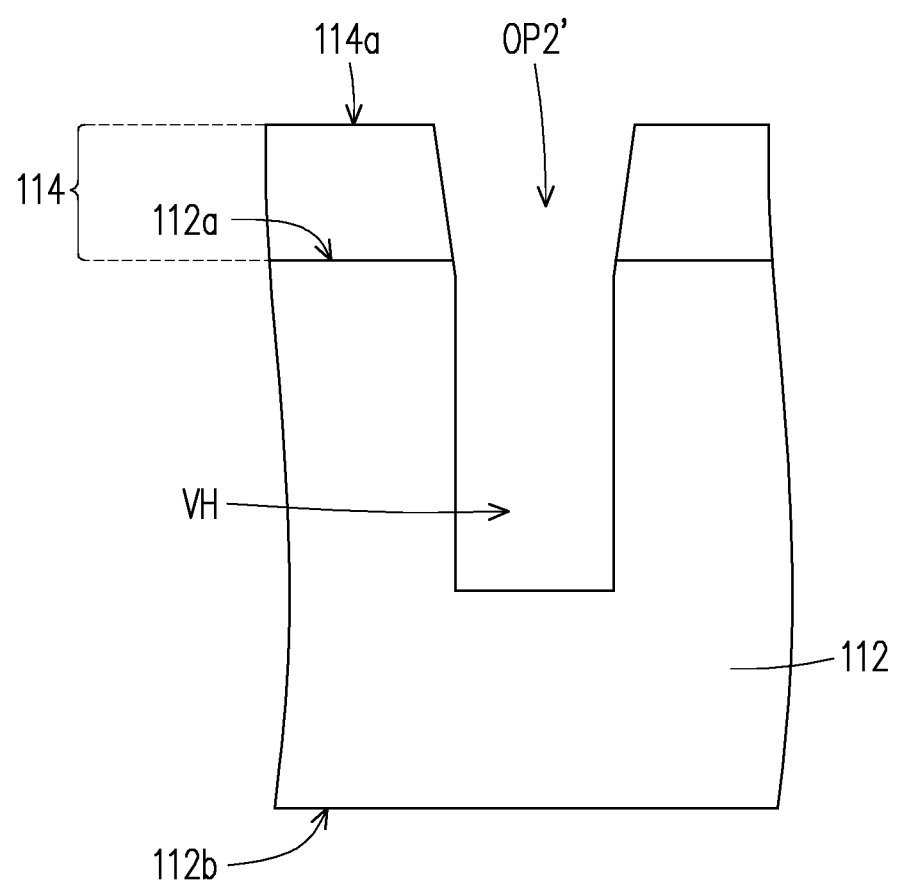

Referring to FIG. 1F and with reference to FIG. 1E, the patterned mask layer PR may be removed to accessibly expose the major surface 114a of the interconnect structure 114. For example, the patterned mask layer PR is removed through an ashing process, a stripping process, or other suitable removal process. A cleaning process is optionally performed to remove any remaining residues on the major surface 114a of the interconnect structure 114 and/or inside the via hole VH of the semiconductor substrate 112. In some other embodiments, the patterned mask layer PR is removed before or during the trimming process.

Figure 1G:
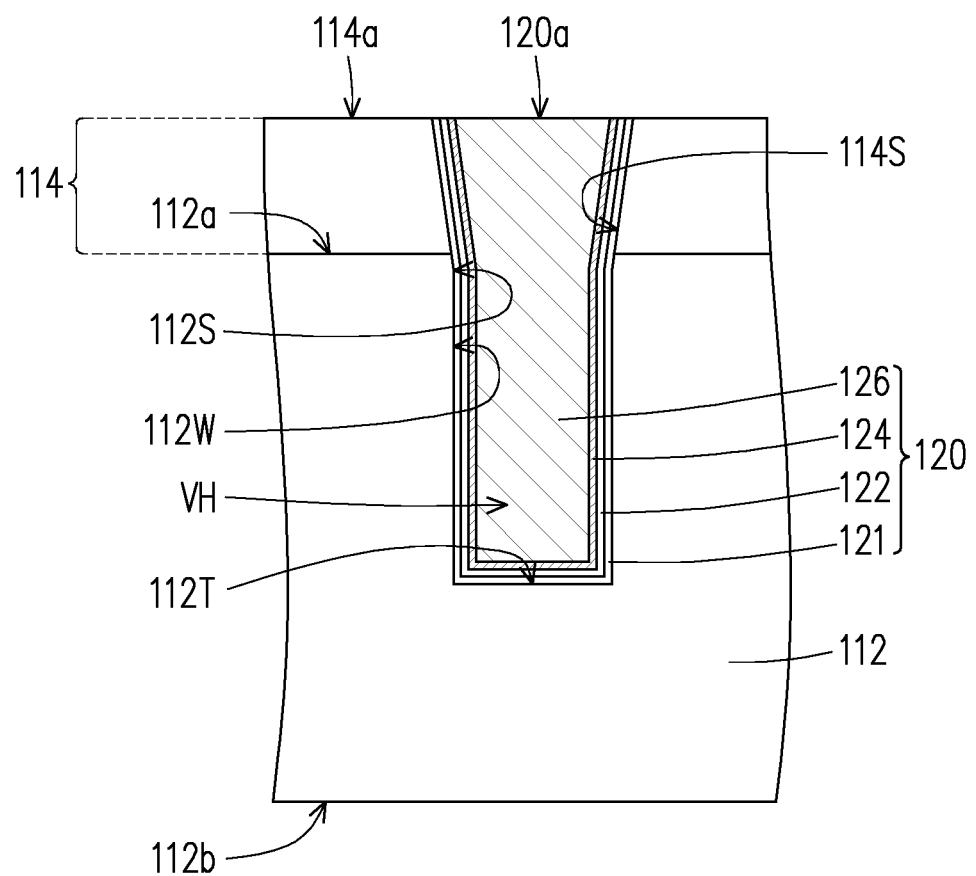

Referring to FIG. 1G and with reference to FIG. 1F, a via-hole filling process may be performed to form a through substrate via (TSV) 120. In some embodiments, an insulating layer 121 is first conformally formed in the via hole VH, and then a diffusion barrier layer 122, a seed layer 124, and a conductive material layer 126 are sequentially formed on the insulating layer 121 and in the via hole VH. For example, the insulating layer 121 is blanketly formed on the inner sidewall 114S of the interconnect structure 114 and continuously extends to cover the inclined inner sidewall 112S, the inner bottom sidewall 112W, and the inner bottom surface 112T of the semiconductor substrate 112. The insulating layer 121 may provide isolation of the conductive material formed in the via hole VH from one or more features. For example, the insulating layer 121 may be or may include silicon oxide, silicon nitride, and/or other suitable insulating materials, and may be formed by any suitable method such as thermal oxidation, deposition, etc. Alternatively, the insulating layer 121 is omitted. The diffusion barrier layer 122 may be conformally formed on the insulating layer 121 in the via hole VH. For example, the diffusion barrier layer 122 may be or may include titanium, titanium nitride, tantalum, tantalum nitride, and combinations thereof, and may be formed using any suitable deposition process such as CVD, PVD, sputtering, and/or the like.

The seed layer 124 may be conformally formed on the diffusion barrier layer 122 in the via hole VH. For example, the seed layer 124 is a metal layer, which may be a single layer or a composite layer including a plurality of sub-layers formed of different materials. In some embodiments, the seed layer 124 includes a titanium layer and a copper layer over the titanium layer. The seed layer 124 may be formed using any suitable deposition process such as CVD, PVD, sputtering, and/or the like. The conductive material layer 126 may be formed on the seed layer 124 and fills the via hole VH. For example, the conductive material layer 126 includes copper, aluminum, tungsten, tantalum, titanium, nickel, silver, gold, metal alloys, combinations thereof, and/or the like, and may be formed by a plating process or other suitable deposition process. In some embodiments where the seed layer is omitted, the conductive material layer 126 may be filled into via hole VH using a seedless plating process. It should be noted that the illustrated TSV is merely an example, one or more barrier and/or adhesion promotion layer may be formed between the conductive material layer 126 and the semiconductor substrate 112.

In some embodiments, the insulating layer 121 and the overlying layers (e.g., the diffusion barrier layer 122, the seed layer 124, and the conductive material layer 126) are sequentially formed on the major surface 114a of the interconnect structure 114 during the deposition process, and may be planarized (or patterned) depending on product and process requirements. For example, the excess portions of these layers on the major surface 114a of the interconnect structure 114 are removed through etching, chemical mechanical polishing (CMP), and/or the like. In some embodiments, after the planarization, the major surface 114a of the interconnect structure 114 is substantially leveled (e.g., coplanar) with a front surface 120a of the TSV 120, where the front surface 120a may include a surface of the insulating layer 121 encircling a surface of the diffusion barrier layer 122, the surface of the diffusion barrier layer 122 encircles a surface of the seed layer 124, the surface of the seed layer 124 encircles a surface of the conductive material layer 126.

The resulting structure shown in FIG. 1G may continue to further process steps such as backside thinning, further metallization processes to provide interconnections, and/or other processes. In some embodiments, the backside thinning process is performed on the rear surface 112b of the semiconductor substrate 112 to accessibly expose the TSV 120 at the back side for further electrical connection. In this manner, the TSV 120 extending from the front surface 112a to the rear surface 112b of the semiconductor substrate 112 may be useful in forming interconnects for stacked wafers, stacked die, and/or combinations thereof. In some embodiments, the interconnect structure 114 may include additional layers of dielectric and conductive material alternately formed on the front surface 120a of the TSV 120 and the major surface 114a, such that the FEOL features formed on the front surface 112a of the semiconductor substrate 112 may be electrically coupled to the TSV 120 through the conductive material layers in the interconnect structure 114. The details of the application of TSV may be discussed in the following figures.

FIGS. 3A-3D are schematic cross-sectional views showing various semiconductor structures having a through substrate via according to some embodiments. The TSV described herein may be or may be a part of an Integrated-Fan-Out (InFO) package, a Chip-On-Wafer-On-Substrate (CoWoS) package, a Chip-On-Wafer (CoW) package, a system on a chip device, a system on integrated circuit devices, etc. The following embodiments are merely examples, and the TSV is not intended to be limited to any particular application type of semiconductor structure. Unless specified otherwise, the materials and the formation methods of the components in these embodiments are essentially the same as the like components, which are denoted by like reference numerals in the embodiments shown in FIGS. 1A-1G. The details regarding the materials of the components may thus be found in the discussion of the embodiments shown in FIGS. 1A-1G.

Figure 3A:
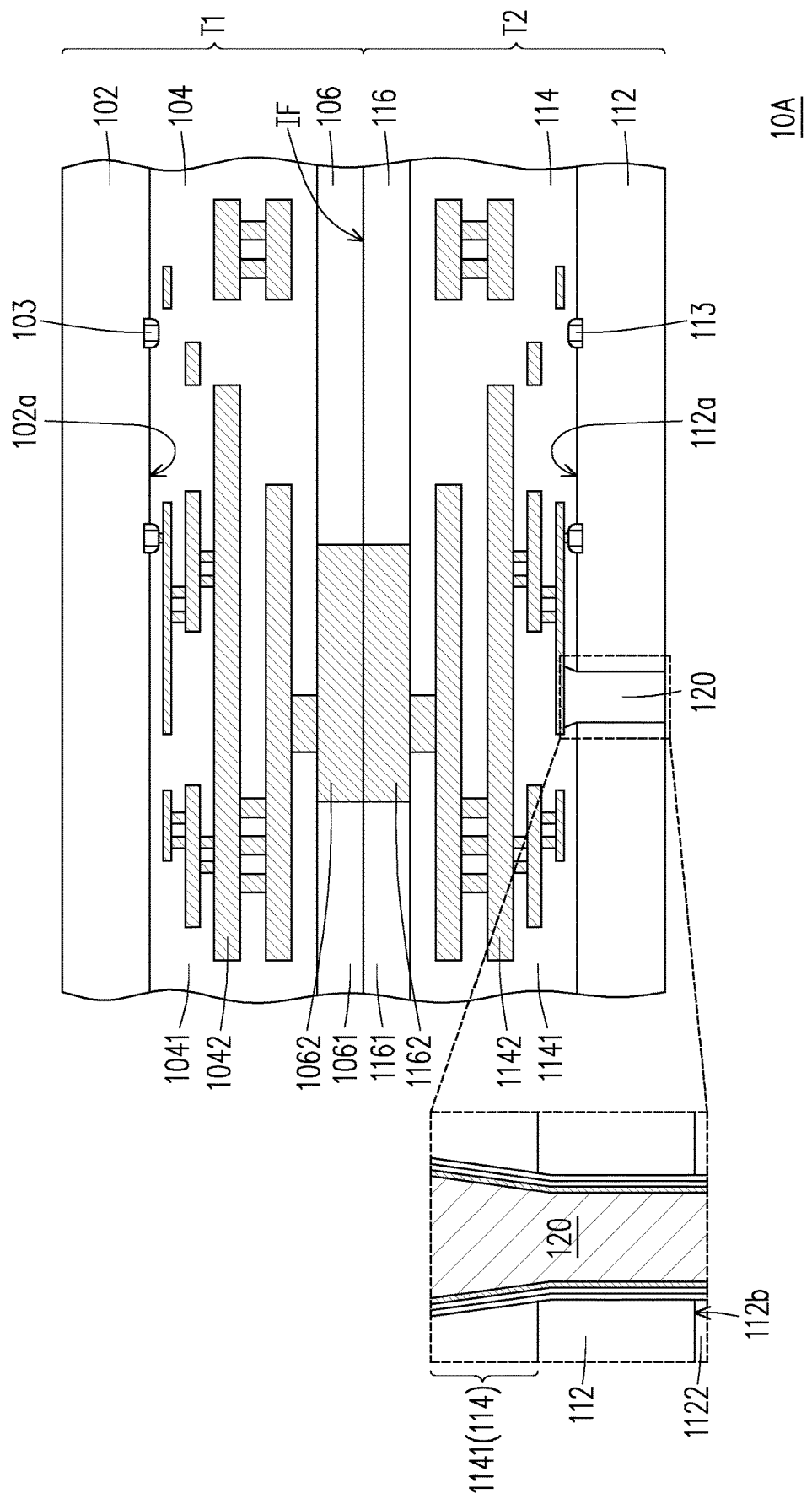
FIGS. 3A-3D are schematic cross-sectional views showing various semiconductor structure having a through substrate via according to some embodiments.

Referring to FIG. 3A, a semiconductor structure 10A including the TSV 120 is provided. The semiconductor structure 10A may be or may include a plurality of dies stacked upon one another, and each die may be viewed as a tier of the semiconductor structure 10A. For example, the semiconductor structure 10A includes a first tier T1 and a second tier T2 bonded to and electrically connecting the first tier T1. Although the structure below the second tier T2 is not shown, it should be understood that the structure below the second tier T2 may be similar to the second tier T2 to form a die stack. Other applications may be possible. The respective tier of the semiconductor structure 10A may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The tiers of the semiconductor structure 10A may perform the same function or different functions.

The first tier T1 may include a first semiconductor substrate 102, a first interconnect structure 104 underlying the first semiconductor substrate 102, a first bonding structure 106 underlying the first interconnect structure 104. The second tier T2 may include a second semiconductor substrate 112, a second interconnect structure 114 overlying the second semiconductor substrate 112, the TSV 120 penetrating through the second semiconductor substrate 112 and extending into the second interconnect structure 114, and a second bonding structure 116 overlying the second interconnect structure 114. For example, the first bonding structure 106 is stacked upon and bonded to the second bonding structure 116. The first semiconductor substrate 102 and the second semiconductor substrate 112 are similar to the semiconductor substrate 112 described in the preceding paragraphs. The semiconductor devices (103 and 113) may be formed on the front surface (102a and 112a) of the first semiconductor substrate 102 and the second semiconductor substrate 112, respectively. The respective semiconductor device (103 and 113) may include the FEOL features such as transistors, diodes, capacitors, resistors, inductors, and/or the like.

The second interconnect structure 114 may include the dielectric layer 1141 and conductive pattern layers 1142 embedded in the dielectric layer 1141. The dielectric layer 1141 may include an ILD formed over the front surface 112a of the semiconductor substrate 112 to cover the semiconductor devices 113. The ILD may include one or more dielectric layers formed of materials such as phosphosilicate glass (PSG), borosilicate glass (BSG), boron-doped phosphosilicate Glass (BPSG), undoped silicate glass (USG), the like, or combinations thereof. The dielectric layer 1141 may include IMD formed on the ILD and providing isolation for the conductive pattern layers 1142. Examples of the IMD include tetraethylorthosilicate (TEOS) oxide, un-doped silicon glass, or doped silicon oxide (e.g., BPSG, PSG, BSG, etc.) and/or other suitable insulating materials. In some embodiments, the TSV 120 extends into the ILD or may extend through the ILD. In some other embodiments, the TSV 120 passes through the ILD and further extends into the IMD. The first interconnect structure 104, similar to the second interconnect structure 114, may include the dielectric layer 1041 and the conductive pattern layers 1042 embedded in the dielectric layer 1041, and the conductive pattern layers 1042 may be electrically coupled to the semiconductor devices 103.

The TSV 120 may extend into the dielectric layers 1141 to be in physical and electrical contact with any level of the conductive pattern layers 1142, and the TSV 120 may be electrically coupled to the semiconductor devices 113 through the conductive pattern layers 1142 of the second interconnect structure 114. In some embodiments, the TSV 120 may extend beyond the rear surface 112b of the semiconductor substrate 112, and an isolating layer 1122 may be formed on the rear surface 112b to laterally cover the portion of the TSV 120 that is protruded from the rear surface 112b. The isolating layer 1122 may separate the second semiconductor substrate 112 from the underlying layers (e.g., metallic layers; not shown). The material of the isolating layer 1122 may be or may include a nitride, an oxide, an oxynitride, carbide, a polymer, and/or the like.

The first bonding structure 106 may include a bonding dielectric layer 1061 and a bonding conductor 1062 embedded in the bonding dielectric layer 1061, where the bonding dielectric layer 1061 underlies the dielectric layer 1041 and the bonding conductor 1062 is electrically coupled to the conductive pattern layers 1042. The second bonding structure 116, similar to the first bonding structure 106, may include a bonding dielectric layer 1161 and a bonding conductor 1162 embedded in the bonding dielectric layer 1161, where the bonding dielectric layer 1161 overlies the dielectric layer 1141 and the bonding conductor 1162 is electrically coupled to the conductive pattern layers 1142. In some embodiments, the bonding dielectric layer 1061 is physically bonded to the bonding dielectric layer 1161, and the bonding conductor 1062 is physically bonded to the bonding conductor 1162 to provide vertical connection between the first tier T1 and the second tier T2. For example, dielectric-to-dielectric bonds and metal-to-metal bonds are formed at the interface IF between the first tier T1 and the second tier T2, and the interface IF may be substantially flat.

Figure 3B:
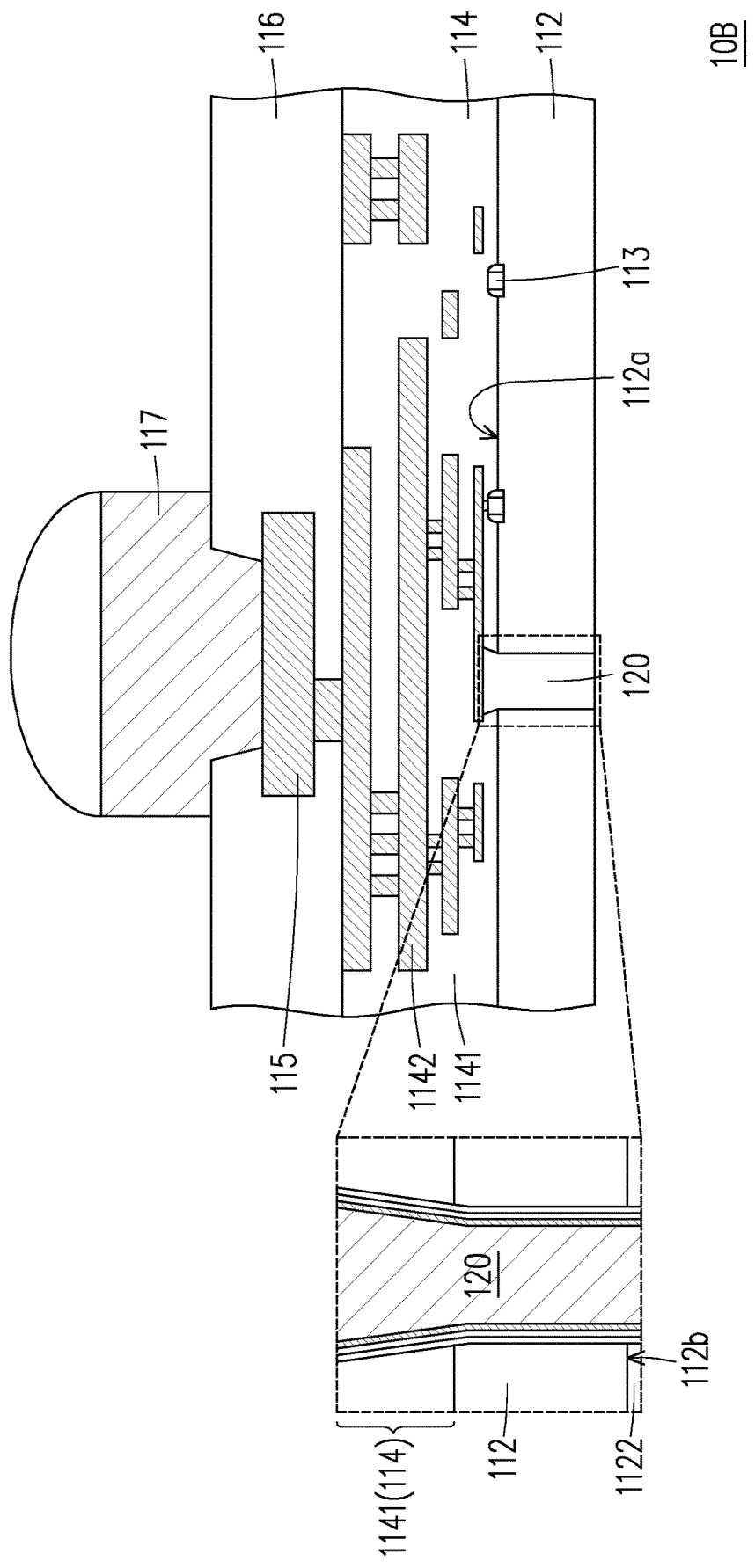

Referring to FIG. 3B, a semiconductor structure 10B including the TSV 120 is provided. The semiconductor structure 10B includes the semiconductor substrate 112, the interconnect structure 114 overlying the semiconductor substrate 112, the TSV 120 penetrating through the semiconductor substrate 112 and extending into the dielectric layer 1141 of the interconnect structure 114. The TSV 120, similar to the TSV described in FIG. 3A, may provide electrical coupling between one or more layers of conductive material within the semiconductor structure 10B. The semiconductor structure 10B may include a contact pad 115 formed on the interconnect structure 114 and electrically coupled to the conductive pattern layers 1142, a passivation layer 116 formed on the dielectric layer 1141 and partially covering the contact pad 115, and a conductive terminal 117 formed on the contact pad 115 and electrically coupled to the semiconductor devices 113 through the contact pad 115 and the conductive pattern layers 1142. The contact pad 115 may be aluminum pad, although other suitable conductive materials (e.g., copper) may be used to for the contact pad 115. In some embodiments, the passivation layer 116 includes one or more layers of silicon oxide, silicon nitride, silicon oxynitride, the like, or a combination thereof. The openings may extend through the passivation layer 116 to the contact pad 115.

The conductive terminal 117 may be formed in the opening of the passivation layer 116 and land on the contact pad 115. In some embodiments, the conductive terminal 117 includes a metal pillar with a metal cap layer, which may be a solder cap, over the metal pillar. For example, the conductive terminal 117 may be or may include micro-bumps, controlled collapse chip connection (C4) bumps, metal pillars, solder balls, ball grid array (BGA) connectors, electroless nickel-electroless palladium-immersion gold (ENEPIG) formed bumps, or the like. The conductive terminal 117 may include a conductive material such as solder, copper, aluminum, gold, nickel, silver, palladium, tin, the like, or a combination thereof. The conductive terminal 117 may include bump shapes and/or may have substantially vertical sidewalls. It is noted that the shape of the conductive terminal 117 shown in FIG. 3B is provided for illustrative purposes, the conductive terminals 170 may have various cross section depending on the design requirements.

Figure 3C:
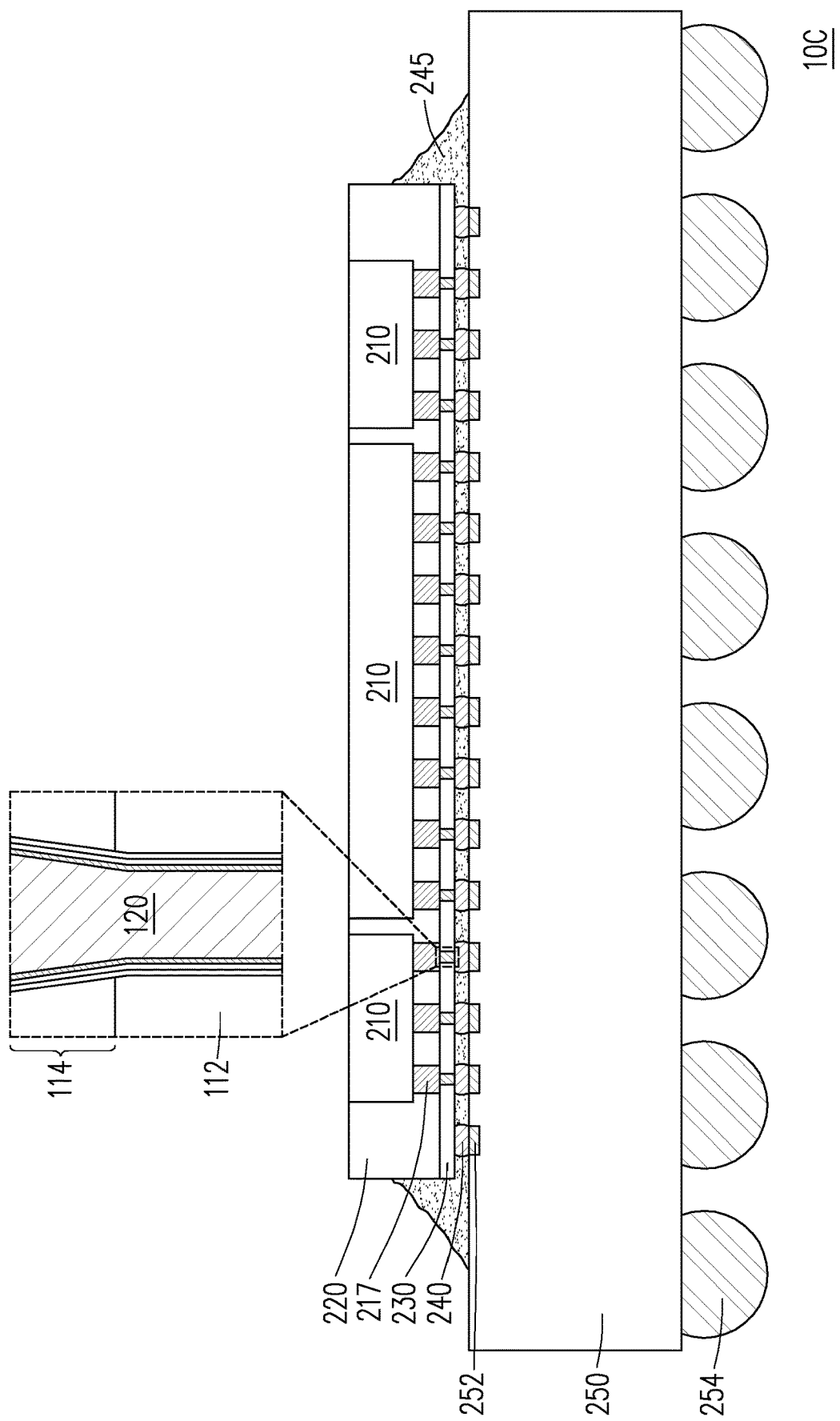

Referring to FIG. 3C and with reference to FIGS. 3A-3B, a semiconductor structure 10C including the TSV 120 is provided. In some embodiments, the semiconductor structure 10C is referred to as a semiconductor package. For example, the semiconductor structure 10C includes integrated circuit (IC) dies 210, an insulating encapsulation 220 laterally covering the IC dies 210, an interposer 230 disposed below the IC dies 210 and the insulating encapsulation 220, and a package substrate 250 disposed below the interposer 230 and electrically coupled to the IC dies 210 through the interposer 230. The interposer 230 may have allowed for a three-dimensional (3D) package that includes multiple IC dies 210 and also provide electrical routing between the one or more IC dies 210 and the package substrate 250.

In some embodiments, one or more IC dies 210 may include the die stack as shown in FIG. 2 or include the structure shown in FIG. 3B. For example, the die connectors 217 of the IC dies 210 are similar to the conductive terminal 117 shown in FIG. 3B. The insulating encapsulation 220 may be formed of a molding compound, epoxy, or the like, and may be applied by compression molding, transfer molding, or the like. For example, the die connectors 217 of the respective IC die 210 are accessibly exposed by the insulating encapsulation 220 for electrically connecting the interposer 230. In some embodiments, the interposer 230 includes the semiconductor substrate 112, the interconnect structure 114 formed on the semiconductor substrate 112, and the TSV 120 penetrating through the semiconductor substrate 112 and extending into the interconnect structure 114. The semiconductor substrate 112 of the interposer 230 may be free of semiconductor devices. In some embodiments, the die connectors 217 of the IC dies 210 are electrically coupled to the TSV 120 through the interconnect structure 114.

In some embodiments, the conductive joints 240 are physically and electrically connected to the interposer 230 and the conductive pads 252 of the package substrate 250. For example, the conductive joints 240 are solder joints. Although the conductive joints 240 may include other suitable conductive material(s). In some embodiments, an underfill layer 245 is formed between the interposer 230 and the package substrate 250 to laterally cover the conductive joints 240 for protection. The underfill layer 245 may extend to cover the sidewall of the interposer 230 and may further extend to cover the sidewall of the insulating encapsulation 220. In some embodiments, the package substrate 250 includes external terminals 254 for further electrical connection, where the external terminals 254 and the conductive pads 252 are formed at two opposing sides of the package substrate 250. For example, the external terminals 254 are connected to another package component such as a printed circuit board (PCB), a printed wiring board, additional package substrate, and/or other carrier that is capable of carrying integrated circuits. It should be noted that other packaging techniques may be used to form the semiconductor structure, which are not limited in the disclosure. The semiconductor structure described herein may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

Figure 3D:
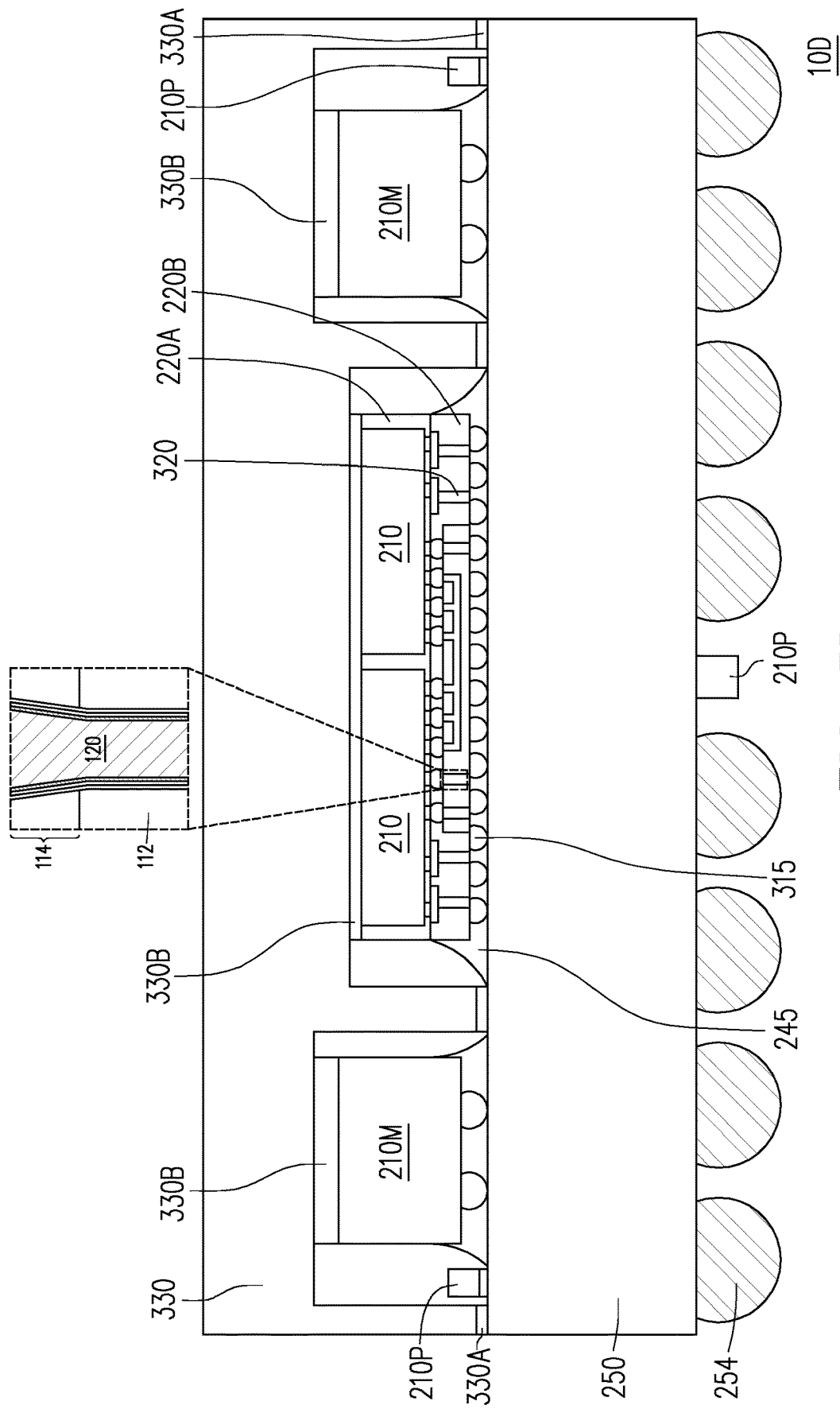

Referring to FIG. 3D, a semiconductor structure 10D including the TSV 120 is provided. In some embodiments, more than one IC die 210 may be encapsulated by a first insulating encapsulation 220A, and a bridge die 310 underlying the IC dies 210 and the insulating encapsulation 220 may be electrically coupled to the IC dies 210. For example, the adjacent IC dies 210 are in electrical communication with each other through the bridge die 310. The bridge die 310 may be covered by a second insulating encapsulation 220B. The first insulating encapsulation 220A and/or the second insulating encapsulation 220B may be similar to the insulating encapsulation 220 described above. A plurality of through insulating vias (TIVs) 320 may surround the bridge die 310 and are laterally covered by the second insulating encapsulation 220B. In some embodiments, the bridge die 310 includes the semiconductor substrate 112, the interconnect structure 114 overlying the semiconductor substrate 112, and the TSVs 120 penetrating through the semiconductor substrate 112 to electrically couple the IC dies 210 to conductive joints 315. For example, the conductive joints 315 connect the TSVs 120 of the bridge die 310 to the package substrate 250 and also connect the TIVs 320 to the package substrate 250.

The semiconductor structure 10D may include various dies such as memory dies 210M disposed on the package substrate 250 and next to the IC dies 210, where the memory dies 210M may be electrically coupled to the IC dies 210 at least through the package substrate 250. In some embodiments, the semiconductor structure 10D includes various passive devices 210P disposed on the package substrate 250 and next to the memory dies 210M. The passive device 210P may be optionally disposed on the package substrate 250 next to the external terminals 254. In some embodiments, the semiconductor structure 10D includes a lid 330 disposed on the package substrate 250 and attached to the IC dies 210 and the memory dies 210M. For example, the lid 330 may be coupled to the package substrate 250 through the adhesive layer 330A. The lid 330 may be thermally coupled to the IC dies 210 and the memory dies 210M through thermal interface material layers 330B. In some embodiments, the adhesive layer 330A and the thermal interface material layers 330B are of the same (or similar) material(s). It should be noted that the semiconductor structure 10D illustrated herein is an example, and other embodiments may use fewer or additional elements.

In accordance with some embodiments, a manufacturing method of a through substrate via includes at least the following steps. A protective liner is formed within an opening of a dielectric layer, where the opening exposes a portion of a semiconductor substrate underlying the dielectric layer. The portion of the semiconductor substrate is removed through the opening, where an overhang portion is formed at a top edge of the semiconductor substrate and masked by the protective liner after the removing. The overhang portion of the semiconductor substrate, the protective liner, and a portion of the dielectric layer adjoining the protective liner is removed to form a via hole. A conductive material is formed in the via hole.

In accordance with some embodiments, a manufacturing method of a through substrate via includes at least the following steps. An opening is formed in a dielectric layer over a semiconductor substrate, where the forming comprises reacting the dielectric layer with an reactant gas to form a first liner in the opening. A second liner is formed on the first liner within the opening. A via hole is formed by etching the semiconductor substrate through the opening after forming the second liner, where a top edge of the semiconductor substrate overhangs the via hole after the etching. The via hole is trimmed. A conductive material is formed in the via hole.

In accordance with some embodiments, a manufacturing method of a through substrate via includes at least the following steps. A dielectric layer overlying a semiconductor substrate is etched to form an opening and the opening is lined with a first liner, where the first liner is an etching byproduct. The first liner is lined with a second liner. The semiconductor substrate is etched in an area not masked by the dielectric layer, the first liner, and the second liner. The first liner, the second liner, and a top edge of the semiconductor substrate directly below the first liner are removed to form a via hole. A conductive material is formed in the via hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a through substrate via, comprising:
    forming a protective liner within an opening of a dielectric layer, wherein the opening exposes a portion of a semiconductor substrate underlying the dielectric layer;
    removing the portion of the semiconductor substrate through the opening, wherein an overhang portion is formed at a top edge of the semiconductor substrate and masked by the protective liner after the removing;
    removing the overhang portion of the semiconductor substrate, the protective liner, and a portion of the dielectric layer adjoining the protective liner to form a via hole; and
    forming a conductive material in the via hole.

2. The manufacturing method of claim 1, wherein forming the protective liner within the opening of the dielectric layer comprises:
    forming a first liner on a sidewall of the opening; and
    forming a second liner on the first liner, wherein the first liner and the second liner are of different materials.

3. The manufacturing method of claim 2, wherein forming the first liner and etching through the dielectric layer to form the opening are performed at the same step.

4. The manufacturing method of claim 3, wherein the first liner is an etching byproduct grown on a sidewall of the dielectric layer.

5. The manufacturing method of claim 2, wherein after removing the portion of the semiconductor substrate through the opening, the overhang portion of the semiconductor substrate is right below the first liner.

6. The manufacturing method of claim 5, wherein after removing the portion of the semiconductor substrate through the opening, the overhang portion of the semiconductor substrate further extends to underlie the second liner.

7. The manufacturing method of claim 2, wherein the second liner is made of a polymer that is sulfur-free.

8. The manufacturing method of claim 1, further comprising:
forming a dielectric material layer on the semiconductor substrate;
forming a patterned mask layer on the dielectric material layer; and
etching the dielectric material layer by using the patterned mask layer to form the dielectric layer with the opening before forming the protective liner within the opening of the dielectric layer.

9. The manufacturing method of claim 8, wherein the patterned mask layer is thinned to a first thickness when forming the opening of the dielectric layer, and the patterned mask layer is further thinned to a second thickness when forming the via hole.

10. The manufacturing method of claim 8, further comprising:
removing the patterned mask layer after forming the via hole.

11. The manufacturing method of claim 1, wherein when forming the via hole, the protective liner is thinned in a lateral direction.

12. The manufacturing method of claim 1, wherein the dielectric layer is made of a low-k dielectric material that has a dielectric constant less than about 3.0.

13. A manufacturing method of a through substrate via, comprising:
forming an opening in a dielectric layer over a semiconductor substrate, wherein the forming comprises reacting the dielectric layer with an reactant gas to form a first liner in the opening;
forming a second liner on the first liner within the opening;
forming a via hole by etching the semiconductor substrate through the opening after forming the second liner, wherein a top edge of the semiconductor substrate overhangs the via hole after the etching;
trimming the via hole; and
forming a conductive material in the via hole.

14. The manufacturing method of claim 13, wherein the first liner is an etching byproduct grown on a sidewall of the dielectric layer.

15. The manufacturing method of claim 13, wherein the second liner is made of a polymer that is sulfur-free.

16. The manufacturing method of claim 13, wherein when forming the via hole, the second liner is laterally thinned.

17. The manufacturing method of claim 13, wherein trimming the via hole comprises removing the top edge of the semiconductor substrate, the second liner, and the first liner.

18. The manufacturing method of claim 13, wherein the opening is formed in the dielectric layer by using an etch mask, and the etch mask is removed after trimming the via hole.

19. A manufacturing method of a through substrate via, comprising:
etching a dielectric layer overlying a semiconductor substrate to form an opening and lining the opening with a first liner, wherein the first liner is an etching byproduct;
lining the first liner with a second liner;
etching the semiconductor substrate in an area not masked by the dielectric layer, the first liner, and the second liner; and
removing the first liner, the second liner, and a top edge of the semiconductor substrate directly below the first liner to form a via hole; and
forming a conductive material in the via hole.

20. The manufacturing method of claim 19, wherein the second liner is made of a polymer that is sulfur-free.

* * * * *